United States Patent
Bedzyk (10) Patent No.: US 6,777,025 B2
(45) Date of Patent: Aug. 17, 2004

(54) TENSIONING UNROLLED DONOR SUBSTRATE TO FACILITATE TRANSFER OF ORGANIC MATERIAL

(75) Inventor: Mark D. Bedzyk, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/325,118

(22) Filed: Dec. 20, 2002

(65) Prior Publication Data

US 2004/0123940 A1 Jul. 1, 2004

(51) Int. Cl.$^7$ .................... B32B 31/00; B44C 1/17; B41M 3/12; C03B 1/00; H05K 3/00

(52) U.S. Cl. .................. 427/171; 427/148; 427/256; 427/457; 427/466; 427/508; 427/514; 156/494; 156/230; 156/238; 156/247; 156/289; 156/253; 156/286; 156/379.8; 156/380.5; 156/510

(58) Field of Search ................. 156/230, 240, 156/238, 216, 228, 247, 289, 244.27, 253, 256, 261, 379.8, 380.5, 382, 443, 468, 494, 510; 427/146, 147, 148, 162, 289, 294, 356, 457, 508, 514, 256, 466, 171

(56) References Cited

U.S. PATENT DOCUMENTS

| | | | |
|---|---|---|---|
| 4,933,042 A | * 6/1990 | Eichelberger et al. | ...... 156/239 |
| 5,342,817 A | * 8/1994 | Sarraf | ......... 503/227 |
| 5,450,117 A | * 9/1995 | Quanz | ......... 347/217 |
| 5,578,416 A | 11/1996 | Tutt | |
| 5,688,551 A | 11/1997 | Littman et al. | |
| 5,742,129 A | 4/1998 | Nagayama et al. | |
| 5,851,709 A | 12/1998 | Grande et al. | |
| 6,114,088 A | 9/2000 | Wolk et al. | |
| 6,140,009 A | 10/2000 | Wolk et al. | |
| 6,190,489 B1 | * 2/2001 | Akitomo et al. | ............ 156/238 |
| 6,194,119 B1 | 2/2001 | Wolk et al. | |
| 6,214,520 B1 | 4/2001 | Wolk et al. | |
| 6,221,553 B1 | 4/2001 | Wolk et al. | |
| 6,555,284 B1 | * 4/2003 | Boroson et al. | ............ 430/201 |
| 6,695,029 B2 | * 2/2004 | Phillips et al. | ............. 156/540 |
| 6,695,030 B1 | * 2/2004 | Phillips et al. | ............. 156/540 |

* cited by examiner

Primary Examiner—J. A. Lorengo
(74) Attorney, Agent, or Firm—Raymond L. Owens (57) ABSTRACT

A method for tensioning unrolled donor substrate to facilitate transfer of organic material to form a layer on the unrolled donor substrate, comprising the steps of: delivering of a portion of the unrolled donor substrate from a roll to a frame disposed in an organic coating chamber, such frame defining an aperture; engaging the unrolled donor substrate and tensioning such material using a first clamp assembly associated with the frame; coating the tensioned donor substrate with an organic layer in the organic coating chamber; and cutting the unrolled tensioned portion of donor substrate into a sheet before or after it has been coated with organic material.

13 Claims, 5 Drawing Sheets

TENSIONING UNROLLED DONOR SUBSTRATE TO FACILITATE TRANSFER OF ORGANIC MATERIAL

CROSS REFERENCE TO RELATED APPLICATIONS

Reference is made to commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device", and commonly assigned U.S. patent application Ser. No. 10/033,459 filed Dec. 27, 2001 by Michael L. Boroson et al., entitled "In-Situ Vacuum Method for Making OLED Devices", the disclosures of which are herein incorporated by reference.

FIELD OF THE INVENTION

The present invention relates to the processing of unrolled donor substrate, which is coated either before or after unrolling with an organic layer so as to facilitate the transfer of organic material from a donor substrate to an OLED device.

BACKGROUND OF THE INVENTION

In color or full-color organic electroluminescent (EL) displays, also known as organic light-emitting diode (OLED) displays or devices, having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium may consist of one or more layers of organic thin films, where one of the layers is primarily responsible for light generation or electroluminescence. This particular layer is generally referred to as the emissive layer of the organic EL medium. Other organic layers present in the organic EL medium may provide electronic transport functions primarily and are referred to as either the hole transport layer (for hole transport) or electron transport layer (for electron transport). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of non-functioning pixels on the EL display.

A method for patterning high-resolution organic EL displays has been disclosed in U.S. Pat. No. 5,851,709 by Grande et al. This method is comprised of the following sequences of steps: 1) providing a substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor substrate and a precision light source, such as a laser, can remove some of the difficulties seen with a patterned donor. Littman and Tang (U.S. Pat. No. 5,688,551) teach the patternwise transfer of organic EL material from an unpatterned donor sheet to an EL substrate. A series of patents by Wolk et al. (U.S. Pat. Nos. 6,114,088; 6,140,009; 6,214,520 and 6,221,553) teaches a method that can transfer the luminescent layer of an EL device from a donor element to a substrate by heating selected portions of the donor with a laser beam.

Such a donor sheet works well for preparing small OLED devices. It can become difficult to handle for larger (greater than 15 cm) OLED devices or when a single manufacturing step prepares multiple OLED devices. Typical donor support material is supplied in roll form. One of the problems in handling an unrolled donor substrate is that it must be held relatively flat and wrinkle-free during organic coating, laser transfer, and transport. It is difficult to coat such a donor substrate evenly when it is not completely flat.

SUMMARY OF THE INVENTION

It is therefore an object of the present invention to provide a way of handling an unrolled donor substrate such that it is held relatively flat and wrinkle-free during organic coating, laser transfer, and transport.

This object is achieved by a method for tensioning unrolled donor substrate to facilitate transfer of organic material to form a layer on the unrolled donor substrate, comprising the steps of:

a) delivering of a portion of the unrolled donor substrate from a roll to a frame disposed in an organic coating chamber, such frame defining an aperture;

b) engaging the unrolled donor substrate and tensioning such material using a first clamp assembly associated with the frame;

c) coating the tensioned donor substrate with an organic layer in the organic coating chamber; and d) cutting the unrolled tensioned portion of donor substrate into a sheet before or after it has been coated with organic material.

This object is also achieved by a method for tensioning unrolled donor substrate coated with at least one organic layer to facilitate transfer of organic material to an OLED substrate from the unrolled donor substrate, comprising the steps of:

a) delivering of a portion of the unrolled donor substrate from a roll to a frame;

b) engaging the unrolled donor substrate and tensioning such material using a first clamp assembly associated with the frame;

c) cutting the unrolled tensioned portion of donor substrate into a sheet.

ADVANTAGES

In the present invention, an unrolled donor substrate material that can be coated with an organic layer either before or after unrolling is handled to facilitate the transfer of the organic layer onto an OLED substrate. It is an advantage of this method/apparatus that it maintains the tension of an unrolled donor substrate when a portion of the unrolled donor substrate is cut into a sheet, thus maintaining the donor free of wrinkles and sag. It is a further advantage that this tension can be maintained throughout further steps in the process. It is a further advantage that this tension can be maintained with no clamps or obstructions above the top surface, thus leaving this surface unobstructed for further operations. It is a further advantage that attachment of the unrolled donor substrate to the frame can be automated easily.

DETAILED DESCRIPTION OF THE INVENTION

Phillips et al., in commonly assigned U.S. patent application Ser. No. 10/021,410 filed Dec. 12, 2001, entitled "Apparatus for Permitting Transfer of Organic Material From a Donor to Form a Layer in an OLED Device", the disclosure of which is herein incorporated by reference, has taught an apparatus that includes a simple rigid frame to allow transfer of a donor element. Such a frame as described by Phillips et al. is adequate for relatively small (less than 15 cm) donor elements, but can be inadequate for larger sheets due to sagging, wrinkling, and other unevenness.

Figure 1:
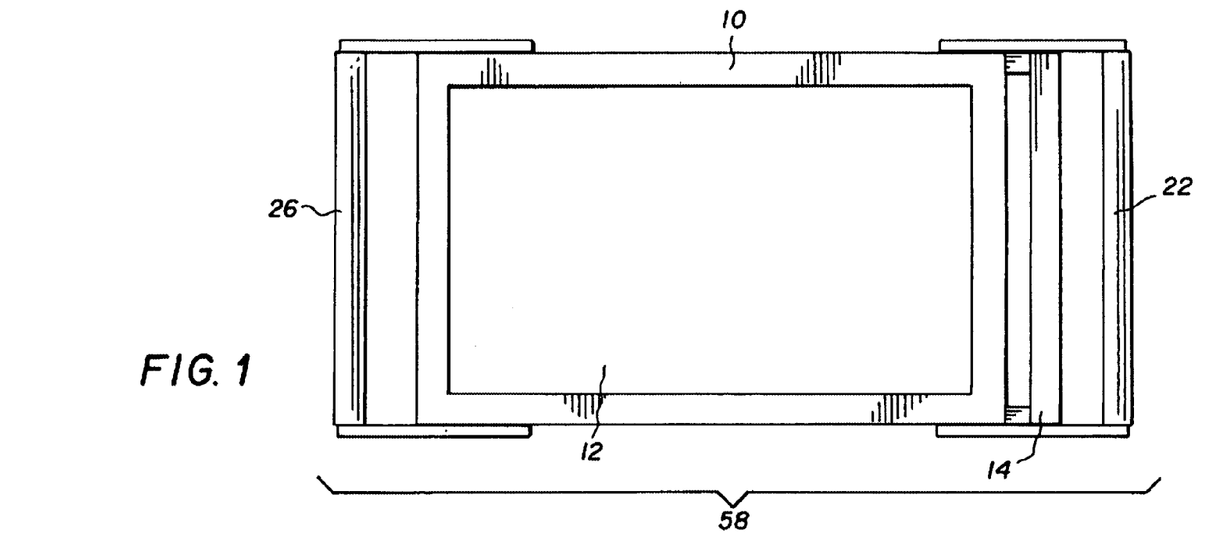
FIG. 1 shows a top view of a frame designed in accordance with this invention.

Turning now to FIG. 1, there is shown a top view of part of one embodiment of an apparatus for tensioning an unrolled donor substrate to facilitate transfer of organic material to an OLED substrate. Such apparatus includes a frame 10 designed in accordance with this invention. Frame 10 defines aperture 12. Aperture 12 can be a coating aperture to facilitate coating of an organic layer, as described by Boroson et al. in commonly assigned U.S. patent application Ser. No. 10/033,459 filed Dec. 27, 2001, entitled "In-Situ Vacuum Method for Making OLED Devices", the disclosure of which is herein incorporated by reference. Aperture 12 can also facilitate transfer of an organic layer to an OLED substrate, as described by Boroson et al and Phillips et al. Frame 10 includes spring-biased member 14, and also includes clamp bases that are not visible in this particular orientation. Moveable members 22 and 26 are attached to frame 10.

Figure 2:
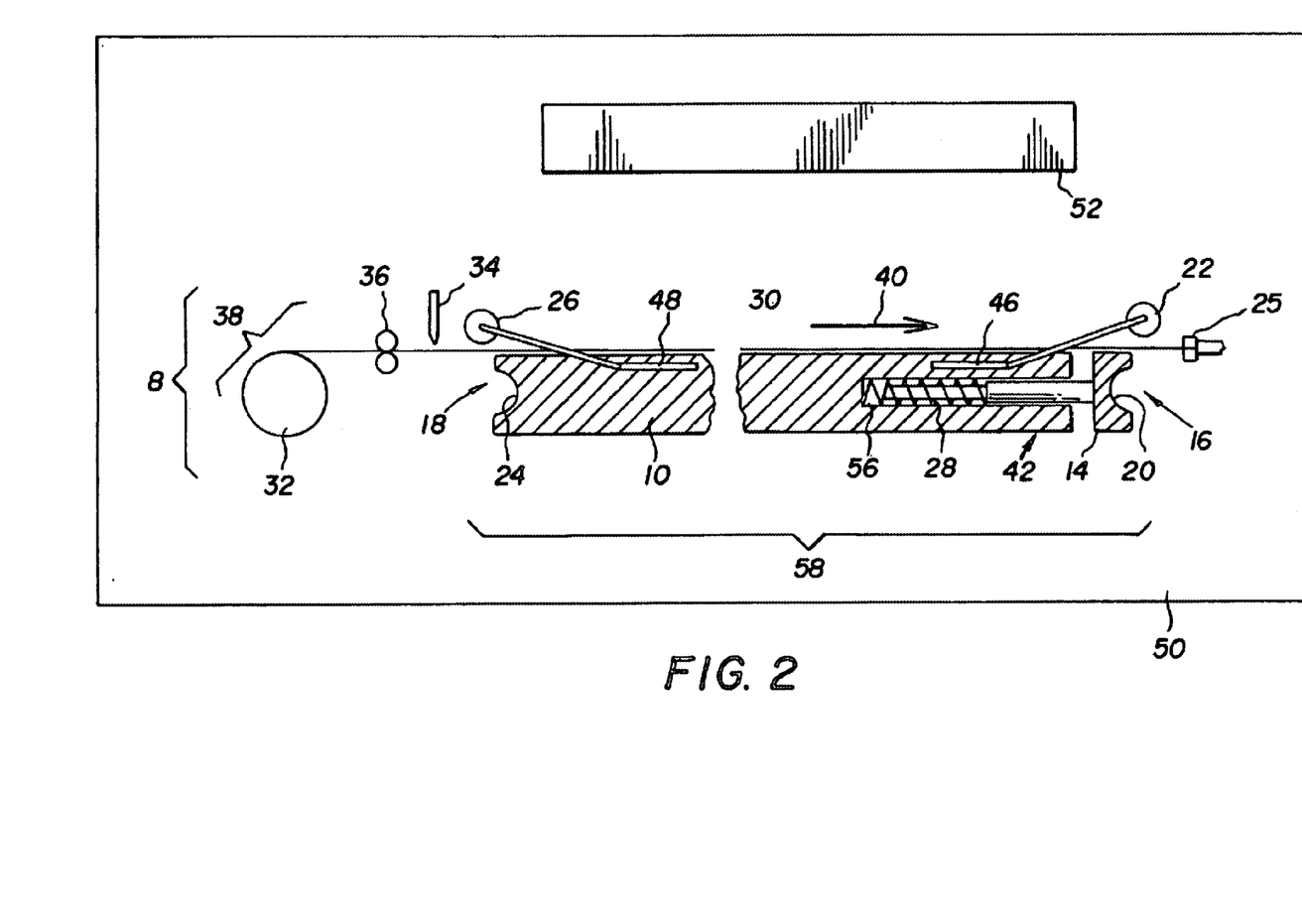
FIG. 2 shows a side view of the above frame in use with an unrolled donor substrate prior to being clamped.

Turning now to FIG. 2, there is shown a side view of one embodiment of an apparatus 8 for tensioning an unrolled donor substrate to facilitate transfer of organic material to an OLED substrate. The apparatus 8 includes a roll of donor substrate, a means for cutting an unrolled portion of the donor substrate into a sheet, and a device disposed relative to a coating chamber and which includes a frame, a means for unrolling and delivering a portion of the donor substrate, and a means for engaging the unrolled donor substrate, all of which will be further described.

The apparatus 8 includes roll 32 of donor substrate 38. Donor substrate 38 is a donor support material for OLED manufacture, and has been described before, e.g. by Tang et al in commonly assigned U.S. Pat. No. 5,904,961. Donor substrate 38 can be made of any of several materials which meet at least the following requirements: the donor substrate 38 must be sufficiently flexible and possess adequate tensile strength to tolerate precoating steps and roll-to-roll or stacked-sheet transport of the support. Donor substrate 38 must be capable of maintaining the structural integrity during the light-to-heat-induced transfer step while pressurized on one side, and during any preheating steps contemplated to remove volatile constituents such as water vapor. Additionally, donor substrate 38 must be capable of receiving on one surface a relatively thin coating of organic material, and of retaining this coating without degradation during anticipated storage periods of the coated support. Substrate materials meeting these requirements include, for example, metal foils, certain plastic foils which exhibit a glass transition temperature value higher than a support temperature value anticipated to cause transfer of the transferable organic materials of the coating on the support, and fiber-reinforced plastic foils. While selection of suitable substrate materials can rely on known engineering approaches, it will be appreciated that certain aspects of a selected substrate material merit further consideration when configured as a useful donor support. For example, the donor substrate 38 can require a multistep cleaning and surface preparation process prior to precoating with transferable organic material. If the substrate material is a radiation-transmissive material, the incorporation into the support or onto a surface thereof, of a radiation-absorptive material can be advantageous to more effectively heat the substrate material and to provide a correspondingly enhanced transfer of transferable organic donor material from the substrate material to the OLED device, when using a flash of radiation from a suitable flash lamp or laser light from a suitable laser. The radiation-absorptive material is capable of absorbing radiation in a predetermined portion of the spectrum and producing heat. Radiation-absorptive material can be a dye such as the dyes specified in commonly assigned U.S. Pat. No. 5,578,416, a pigment such as carbon, or a metal such as nickel, chromium, titanium, etc.

Donor substrate 38 can be uncoated, or can be coated with one or more organic layers. If coated, unrolled donor substrate 30 tensioned by frame 10 can be used to facilitate transfer of organic material to an OLED substrate. If uncoated, unrolled donor substrate 30 tensioned by frame 10 can be coated with an organic layer by coating apparatus 52, and subsequently used to facilitate transfer of organic material to an OLED substrate. Alternatively, unrolled donor substrate 30 can be tensioned by frame 10 in another location, then moved into coating chamber 50 for coating with an organic layer, then moved into a laser thermal transfer chamber for transfer of the organic material to an OLED substrate. The laser thermal transfer chamber and coating chamber 50 can be the same chamber, as described by Boroson et al. By OLED substrate, it is meant a substrate commonly used for preparing OLED displays, e.g. active-matrix low-temperature polysilicon TFT substrate. The OLED substrate can either be light transmissive or opaque, depending on the intended direction of light emission. The light transmissive property is desirable for viewing the EL emission through the OLED substrate. Transparent glass or plastic are commonly employed in such cases. For applications where the EL emission is viewed through the top electrode, the transmissive characteristic of the bottom support is immaterial, and therefore can be light transmissive, light absorbing or light reflective. OLED substrates for use in this case include, but are not limited to, glass, plastic, semiconductor materials, ceramics, and circuit board materials.

The tensioning apparatus 8 further includes a device 58. Device 58 is disposed in organic coating chamber 50 that includes coating apparatus 52, the latter of which can be disposed above or below device 58. Coating apparatus 52 can be an apparatus that provides coating by any of several well known coating methods, e.g. curtain coating, spraying, gravure coating, spin coating, evaporation, and sputtering. This can include vapor deposition apparatus such as that described in U.S. Pat. No. 6,237,529, or any other apparatus capable of coating the materials in a vacuum. The exact nature of coating apparatus 52 will depend on various factors, including the conditions within coating chamber 50 and the nature of donor substrate 38. Device 58 includes frame 10, which as noted defines aperture 12. Frame 10 includes tensioning mechanism 42, which comprises first clamp assembly 16 and spring 28. First clamp assembly 16 includes spring-biased member 14 provided in frame 10 and moveable member 22. Spring-biased member 14 is moveable along a path defined by channel 56. Spring 28 is in engagement with spring-biased member 14 via pressure against frame 10 and urges spring-biased member 14 in first direction 40 along a path defined by channel 56.

Device 58 further includes feed rollers 36 or other means for unrolling and delivering a portion of donor substrate 38 from the roll 32 to device 58 including frame 10 so that a portion of donor substrate 38 is unrolled and disposed over aperture 12 as unrolled donor substrate 30. Device 58 further includes a means for engaging unrolled donor substrate 30 and causing the material to be engaged with first clamp assembly 16 to tension unrolled donor substrate 30. Initial tension can be provided by an associated means or device, such as articulated clamp 25. Articulated clamp 25 can grasp the portion of donor substrate 38 that has been delivered by feed rollers 36 and further deliver it so that donor substrate 38 is disposed over aperture 12. Those skilled in the art will understand that a variety of means will serve the same purpose, for example articulated rollers, multiple edge rollers, or manual tension. Feed rollers 36 can deliver donor substrate 38 completely over aperture 12 by pushing it providing that the substrate has sufficient stiffness. A means of pulling such as articulated clamp 25 has the additional advantage of providing tension until clamp assembly 16 engages the donor substrate 38.

Spring-biased member 14 includes clamp base 20, which in this embodiment is a groove. Moveable member 22 is designed to fit into clamp base 20 so as to firmly engage a flexible sheet, e.g. unrolled donor substrate 30, and allow spring-biased member 14 to tension the material. When the material is properly tensioned, unrolled donor substrate 30 can be coated if necessary with an organic layer from coating apparatus 52 in coating chamber 50.

Apparatus 8 further includes knife 34 or other means for cutting the unrolled portion of donor substrate 38 into a sheet after it has been properly tensioned. Such a cutting step can be effected before or after the unrolled portion of donor substrate 38 has been coated with organic material by coating apparatus 52 in coating chamber 50.

Apparatus 8 can further include a second clamp assembly 18 formed at least in part in frame 10, which comprises clamp base 24 and moveable member 26, and which is functionally similar to first clamp assembly 16 except that second clamp assembly 18 does not include a spring-biased member. First clamp assembly 16 and second clamp assembly 18 define clamp bases 20 and 24, respectively, as corresponding grooves in this embodiment. Moveable members 22 and 26 are two spaced apart members that are both moveable, via slots 46 and 48, respectively, from a disengaged position as shown into engagement with unrolled donor substrate 30, thus forcing unrolled donor substrate 30 into corresponding clamp bases 20 and 24, respectively. In other embodiments, moveable members 22 and 26 can be attached by other means to frame 10 or can be separate.

It will be understood that the exact shape, size, and material composition of clamp bases 20 and 24 and moveable members 22 and 26 will depend upon a number of factors, including the composition, thickness, and flexibility of the donor substrate material one desires to hold in the frame. Moveable members 22 and 26 can be formed from a compliant material, e.g. rubber, so as to better fit into clamp bases 20 and 24, respectively.

Figure 3A:
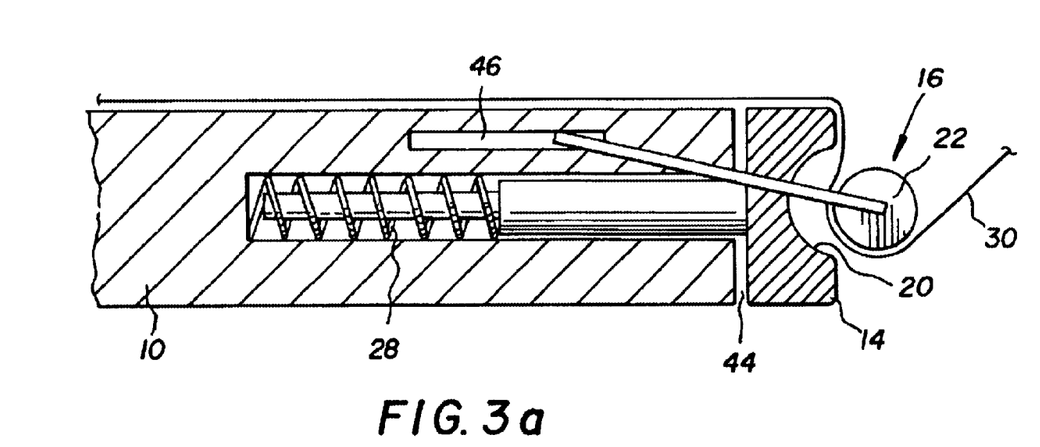
FIG. 3a shows a side view of the above frame showing an intermediate position between unclamped and clamped conditions.

Turning now to FIG. 3a, there is shown a side view of a portion of the above frame 10 showing the moveable member 22 which has been moved from a disengaged position to a lowered position so as to engage unrolled donor substrate 30 over the groove of clamp base 20 of clamp assembly 16. In this embodiment, spring-biased member 14 has also been forced into the frame 10 in opposition to the urging of spring 28, that is spring 28 has been compressed or preloaded. It is important that spring-biased member 14 not be compressed completely against frame 10 so as to ensure that tensioning of unrolled donor substrate 30 will be provided entirely by the pressure of spring 28. Thus a gap 44 must be maintained.

Figure 3B:
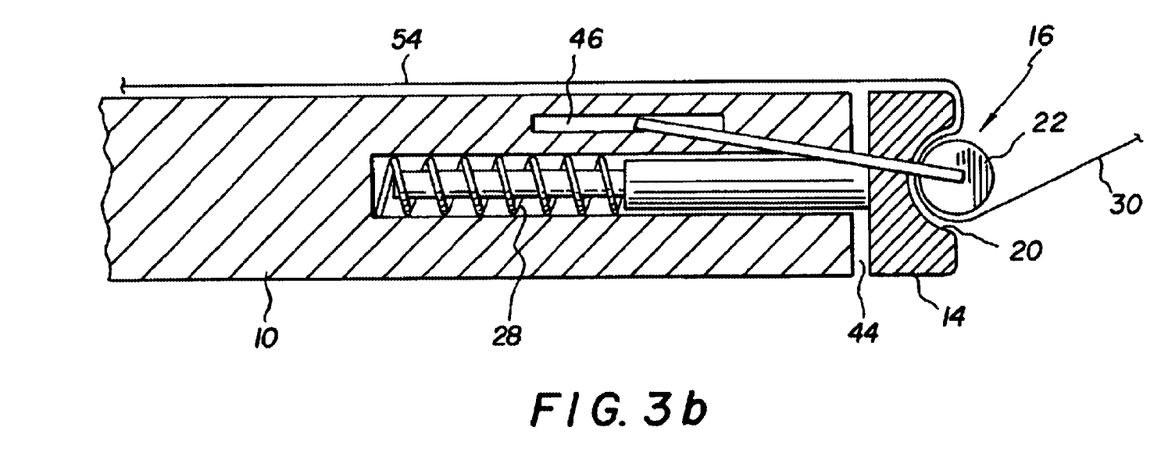
FIG. 3b shows a side view of the above frame showing the clamp assembly engaging the unrolled donor substrate.

Turning now to FIG. 3b, there is shown a side view of a portion of the above frame 10 showing that moveable member 22 has further moved into engagement with unrolled donor substrate 30 and forcing the unrolled donor substrate 30 into the groove that is clamp base 20 of clamp assembly 16. It will be understood that moveable member 22 and unrolled donor substrate 30 are meant to fit snugly into clamp base 20 and are not shown as snug in FIG. 3b for clarity of illustration.

By a similar process, unrolled donor substrate 30 can be engaged with the second clamp assembly 18, that is, moveable member 26 shown in FIG. 2 can be moved from a disengaged position into engagement with unrolled donor substrate 30, forcing such material into the groove that is clamp base 24 of clamp assembly 18. Spring-biased member 14 will then tension unrolled donor substrate 30 in frame 10 by the urging of spring 28, thus forming tensioned donor substrate 54, which can also be termed the unrolled tensioned portion of the donor substrate. Tensioned donor substrate 54 can then facilitate the transfer of organic material by preventing sagging or wrinkling in a transfer apparatus such as disclosed by Phillips et al.

Figure 4:
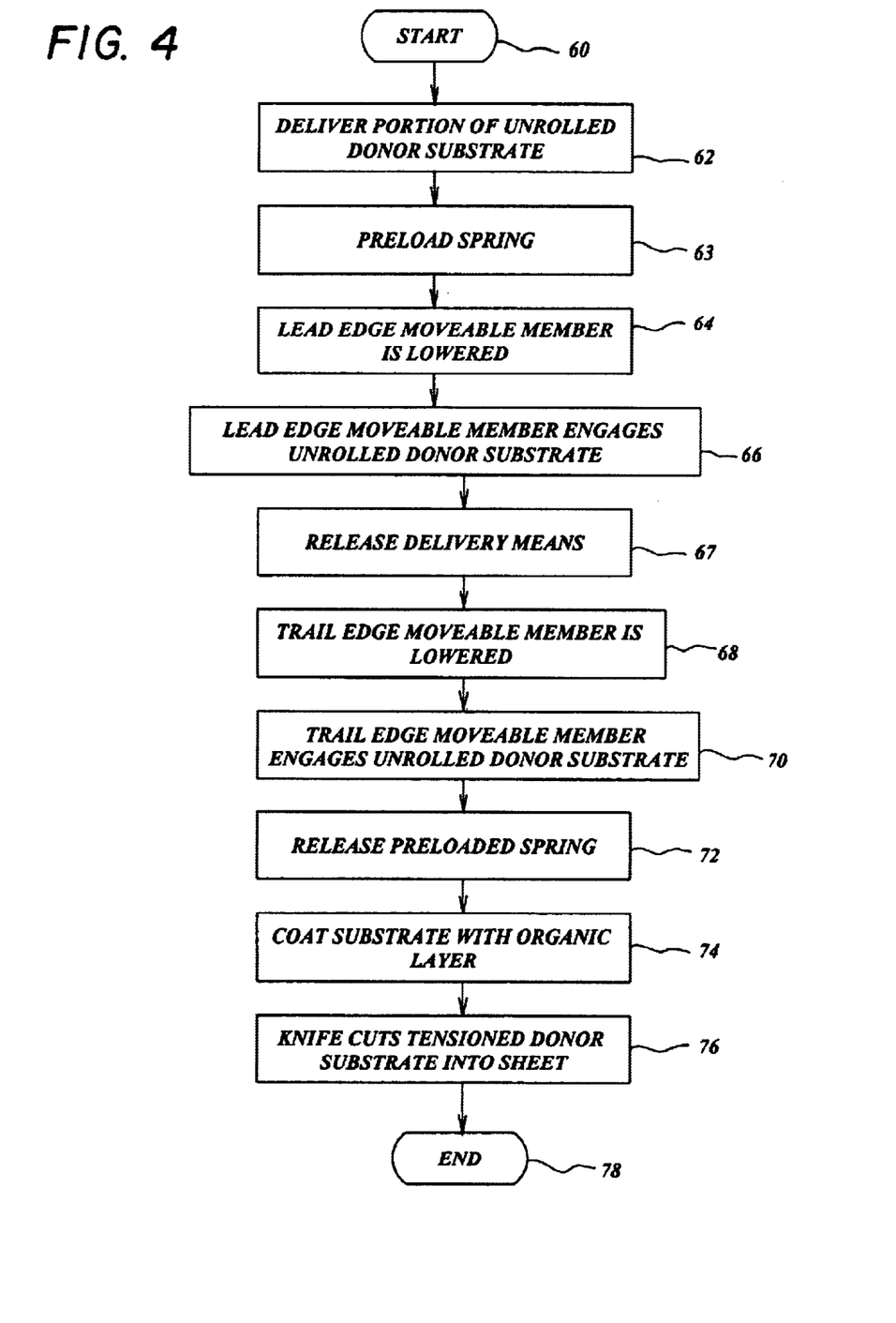
FIG. 4 is a block diagram showing the steps involved in one embodiment of a method according to the present invention.

Turning now to FIG. 4, there is shown a block diagram showing the steps in one embodiment of a method for tensioning unrolled donor substrate to facilitate coating of organic material on the unrolled donor substrate. At the start (Step 60), feed rollers 36 and/or other means for unrolling and delivering a portion of donor substrate 38 such as articulated clamp 25 delivers a portion of unrolled donor substrate 30 from roll 32 to frame 10 disposed in organic coating chamber 50 (Step 62) such that unrolled donor substrate 30 is disposed over aperture 12. Spring 28 is preloaded by compressing spring-biased member 14 toward frame 10 (Step 63). Compressing spring-biased member 14 can be done by an actuator in an apparatus into which frame 10 can fit. Once unrolled donor substrate 30 is completely fed, the two spaced apart moveable members 22 and 26 are moved from a disengaged position into engagement with unrolled donor substrate 30 so that unrolled donor substrate 30 is forced into first and second clamp assemblies 16 and 18. Specifically, the leading edge of moveable member 22 is lowered (Step 64) and engages unrolled donor substrate 30 in first clamp assembly 16 (Step 66), after which the delivery means (e.g. articulated clamp 25) can be released (Step 67). In a like manner, the trailing edge of moveable member 26 is lowered (Step 68) and engages unrolled donor substrate 30 in second clamp assembly 18 (Step 70). Preloaded spring 28 is released (Step 72), that is spring-biased member 14 is no longer restrained against the urging of spring 28, as unrolled donor substrate 30 is now tensioned by the clamp assemblies 16 and 18 associated with frame 10. Coating apparatus 52 then coats tensioned donor substrate 54 with an organic layer in organic coating chamber 50 (Step 74). Knife 34 or other means for cutting the unrolled portion of donor substrate 38 then cuts the unrolled tensioned portion of donor substrate into a sheet (Step 76). The process then ends (Step 78).

It will be understood that variations in the order of these steps is possible while providing the same result. For example, the preloading of spring 28 (Step 63) can occur concurrently with the engaging of moveable member 22 against clamp base 20 (Step 66). Cutting the tensioned donor substrate 54 into a sheet (Step 76) can occur before or after coating it with an organic layer (Step 74), and the coating step (Step 74) can be left out entirely.

Figure 5:
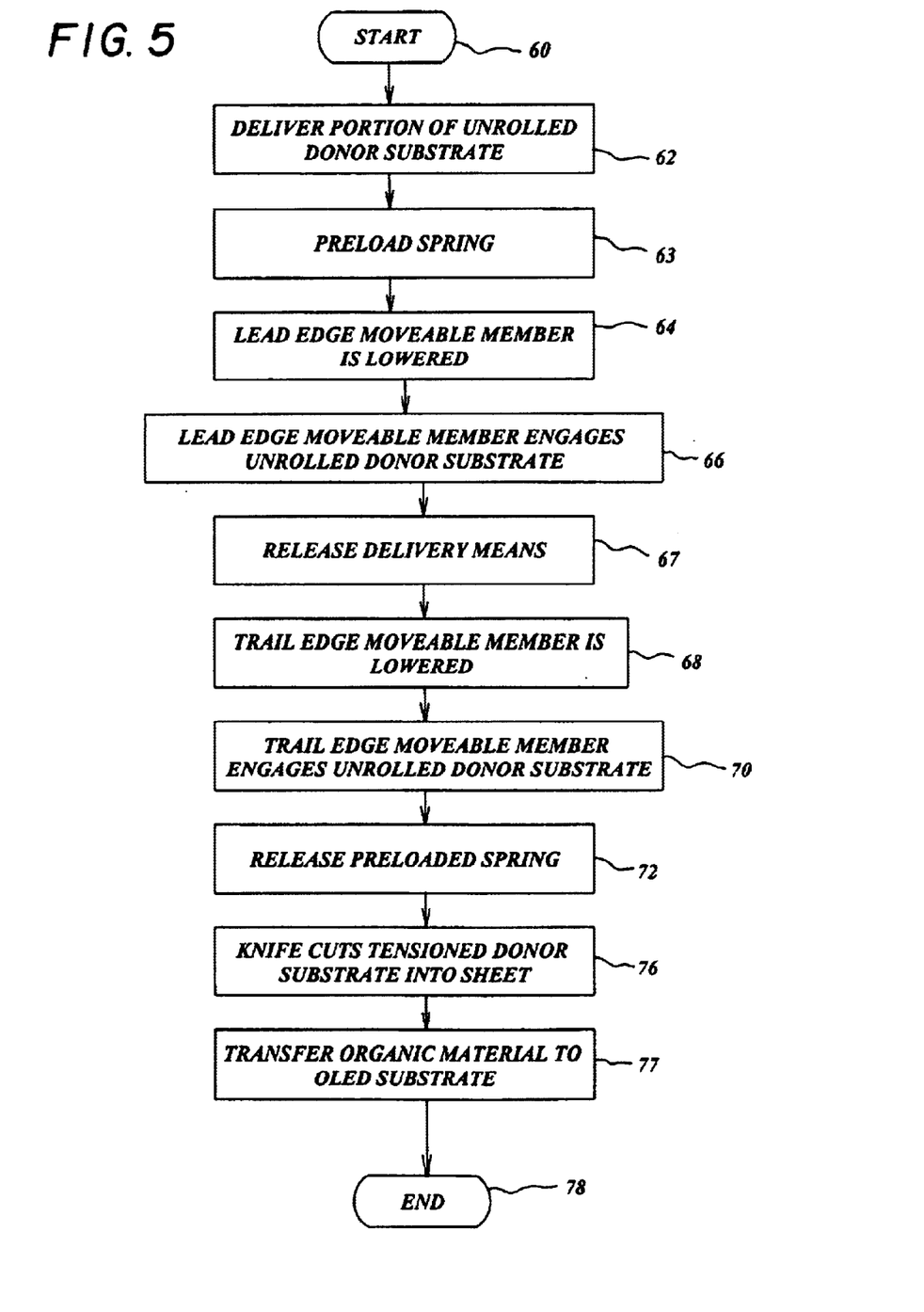
FIG. 5 is a block diagram showing the steps involved in another embodiment of a method according to the present invention.

Turning now to FIG. 5, there is shown a block diagram showing the steps in another embodiment of a method for tensioning unrolled donor substrate, in this case to facilitate transfer of organic material to an OLED substrate from the unrolled donor substrate in a laser thermal transfer chamber. At the start (Step 60), feed rollers 36 and/or other means for unrolling and delivering a portion of donor substrate 38 such as articulated clamp 25 delivers a portion of unrolled donor substrate 30 from roll 32 to frame 10 disposed in organic coating chamber 50 (Step 62) such that unrolled donor substrate 30 is disposed over aperture 12. Spring 28 is preloaded by compressing spring-biased member 14 toward frame 10 (Step 63). Compressing spring-biased member 14 can be done by an actuator in an apparatus into which frame 10 can fit. Once unrolled donor substrate 30 is completely fed, the two spaced apart moveable members 22 and 26 are moved from a disengaged position into engagement with unrolled donor substrate 30 so that unrolled donor substrate 30 is forced into first and second clamp assemblies 16 and 18. Specifically, the leading edge of moveable member 22 is lowered (Step 64) and engages unrolled donor substrate 30 in first clamp assembly 16 (Step 66), after which the delivery means (e.g. articulated clamp 25) can be released (Step 67). In a like manner, the trailing edge of moveable member 26 is lowered (Step 68) and engages unrolled donor substrate 30 in second clamp assembly 18 (Step 70). Preloaded spring 28 is released (Step 72), that is spring-biased member 14 is no longer restrained against the urging of spring 28, as unrolled donor substrate 30 is now tensioned by the clamp assemblies 16 and 18 associated with frame 10. Knife 34 or other means for cutting the unrolled portion of donor substrate 38 then cuts the unrolled tensioned portion of donor substrate into a sheet (Step 76). The tensioned donor substrate 54 can then be used in a laser transfer process to transfer organic material from tensioned donor substrate 54 to an OLED substrate in a laser thermal transfer chamber (Step 77). Such a process has been described by, e.g. Phillips et al., in commonly assigned U.S. patent application Ser. No. 10/021,410 filed Dec. 12, 2001, entitled "Apparatus for Permitting Transfer of Organic Material From a Donor to Form a Layer in an OLED Device", the disclosure of which is herein incorporated by reference. The process then ends (Step 76).

Figure 6:
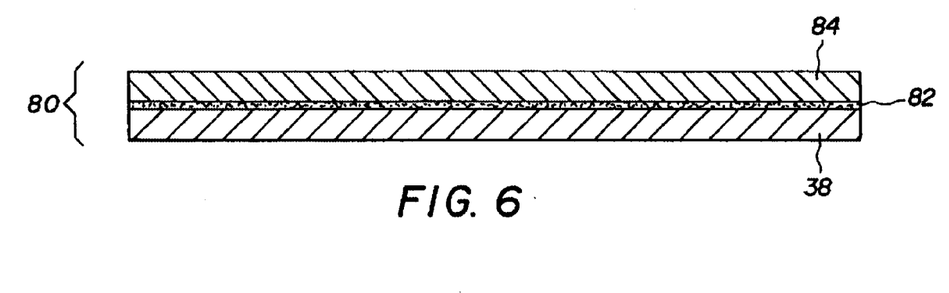
FIG. 6 is a cross-sectional view of a coated donor substrate prepared according to the present invention.

Turning now to FIG. 6, there is shown a cross-sectional view of an example of coated donor substrate 80 prepared by this method. Coated donor substrate 80 includes donor substrate 38. In this example, coated donor substrate 80 also includes optional radiation-absorptive layer 82. Coated donor substrate 80 also includes organic layer 84, which was coated in Step 74.

Organic layer 84 can include any organic material used in the formation of an OLED device. A typical OLED device can contain the following layers, usually in this sequence: an anode, a hole-injecting layer, a hole-transporting layer, a light-emitting layer, an electron-transporting layer, and a cathode. The organic material can include a hole-injecting material, a hole-transporting material, an electron-transporting material, a light-emitting material, a host material, or a combination of any of these materials. These materials are described below.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075 B1. Alternative hole-injecting materials reportedly useful in organic EL devices are described in EP 0 891 121 A1 and EP 1,029,909 A1.

Hole-Transport (HT) Material

Hole-transport materials useful as coated material are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel, et al. U.S. Pat. No. 3,180,730. Other suitable triarylamines substituted with one or more vinyl radicals and/or comprising at least one active hydrogen containing group are disclosed by Brantley, et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A).

A wherein $Q_1$ and $Q_2$ are independently selected aromatic tertiary amine moieties and G is a linking group such as an arylene, cycloalkylene, or alkylene group of a carbon-to-carbon bond. In one embodiment, at least one of $Q_1$ or $Q_2$ contains a polycyclic fused ring structure, e.g., naphthalene. When G is an aryl group, it is conveniently a phenylene, biphenylene, or naphthalene moiety.

A useful class of triarylamines satisfying structural Formula (A) and containing two triarylamine moieties is represented by structural Formula (B):

B where:

R$_1$ and R$_2$ each independently represents a hydrogen atom, an aryl group, or an alkyl group or R$_1$ and R$_2$ together represent the atoms completing a cycloalkyl group; and

R$_3$ and R$_4$ each independently represents an aryl group, which is in turn substituted with a diary substituted amino group, as indicated by structural Formula (C):

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D).

D wherein:

each Are is an independently selected arylene group, such as a phenylene or anthracene moiety;

n is an integer of from 1 to 4; and

Ar, R$_7$, R$_8$, and R$_9$ are independently selected aryl groups.

In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-Tetra-1-naphthyl-4,4'-diaminobiphenyl
N,N,N',N'-Tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041 A2. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly (4-styrenesulfonate), also called PEDOT/PSS.

Light-Emitting Material

Light-emitting materials useful as the organic material are well known. Such donor materials can comprise components to make a light-emitting layer in an OLED device. As more fully described in U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The donor material and the light-emitting layer produced from it can be comprised of a single material, but more commonly consists of two or more components, e.g. a host material doped with a light-emitting guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g. green, yellow, orange, and red.

E wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithum oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g. blue, green, yellow, orange or red.

F wherein:
$R^1$, $R^2$, $R^3$, and $R^4$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g. blue, green, yellow, orange or red.

G wherein:
n is an integer of 3 to 8;
Z is O, NR or S;
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;
L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1

L2

L3

L4

L5

L6

L7

L8

-continued

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

L45

L46

-continued

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk, et al. in commonly assigned U.S. Pat. No. 6,194,119 B1 and references therein.

Electron-Transport (ET) Material

Preferred electron-transport materials for use in organic EL devices of the present invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (I) are also useful electron-transporting materials.

Other electron-transport materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

In some instances, one organic layer 84 can include two or more different organic materials. For example, a single layer can serve the function of supporting both light emission and electron transportation, and will therefore include emissive material and electron-transporting material. Other embodiments that include two or more organic layers 84 are also possible.

Coated donor substrate 80 can be used in a patternwise transfer of organic material from tensioned donor substrate 54 to an OLED substrate. Such a process using laser transfer has been described by Phillips et al. in commonly assigned U.S. patent application Ser. No. 10/021,410 filed Dec. 12, 2001, entitled "Apparatus for Permitting Transfer of Organic Material From a Donor to Form a Layer in an OLED Device", the disclosure of which is herein incorporated by reference The invention has been described in detail with particular reference to certain preferred embodiments thereof, but it will be understood that variations and modifications can be effected within the spirit and scope of the invention.

| PARTS LIST | |
|---|---|
| 8 | apparatus |
| 10 | frame |
| 12 | aperture |
| 14 | spring-biased member |
| 16 | clamp assembly |
| 18 | clamp assembly |
| 20 | clamp base |
| 22 | moveable member |
| 24 | clamp base |
| 25 | articulating clamp |
| 26 | moveable member |
| 28 | spring |
| 30 | unrolled donor substrate |
| 32 | roll |
| 34 | knife |
| 36 | feed rollers |
| 38 | donor substrate |
| 40 | first direction |
| 42 | tensioning mechanism |
| 44 | gap |
| 46 | slot |
| 43 | slot |
| 50 | coating chamber |
| 52 | coating apparatus |
| 54 | tensioned donor substrate |
| 56 | channel |
| 58 | device |
| 60 | block |
| 62 | block |
| 63 | block |
| 64 | block |
| 66 | block |
| 67 | block |
| 68 | block |
| 70 | block |
| 72 | block |
| 74 | block |
| 76 | block |
| 78 | block |
| 80 | coated donor substrate |
| 82 | radiation-absorptive layer |
| 84 | organic layer |

What is claimed is:

1. A method for tensioning unrolled donor substrate to facilitate transfer of organic material to form a layer on the unrolled donor substrate, comprising the steps of:

a) delivering of a portion of the unrolled donor substrate from a roll to a frame disposed in an organic coating chamber, such frame defining an aperture;

b) engaging the unrolled donor substrate and tensioning such material using a first clamp assembly associated with the frame;

c) coating the tensioned donor substrate with an organic layer in the organic coating chamber; and d) cutting the unrolled tensioned portion of donor substrate into a sheet before or after it has been coated with organic material.

2. The method of claim 1 wherein the first clamp assembly includes a spring-biased member provided in the frame.

3. The method of claim 2 further including a second clamp assembly formed in part in the frame, the first and second clamp assemblies each defining grooves and further including the step of moving two spaced apart moveable members from a disengaged position into engagement with the unrolled donor substrate and forcing such material into the first and second clamp assemblies.

4. The method of claim 3 wherein the moveable members are made of compliant material.

5. The method of claim 1 further including using laser transfer to transfer organic material from the tensioned donor substrate to an OLED substrate.

6. A method for tensioning unrolled donor substrate coated with at least one organic layer to facilitate transfer of organic material to an OLED substrate from the unrolled donor substrate, comprising the steps of:

a) delivering of a portion of the unrolled donor substrate from a roll to a frame;

b) engaging the unrolled donor substrate and tensioning such material using a first clamp assembly associated with the frame; and c) cutting the unrolled tensioned portion of donor substrate into a sheet.

7. The method of claim 6 wherein the first clamp assembly includes a spring-biased member provided in the frame.

8. The method of claim 7 further including a second clamp assembly formed in the frame, the first and second clamp assemblies each defining grooves and further including the step of moving two spaced apart moveable members from a disengaged position into engagement with the unrolled donor substrate and forcing such material into the first and second clamp assemblies.

9. The method of claim 8 wherein the moveable members are made of compliant material.

10. The method of claim 6 further including using laser transfer to transfer organic material from the tensioned donor substrate to an OLED substrate.

11. Apparatus for tensioning unrolled donor substrate to facilitate transfer of organic material to an OLED substrate from the unrolled donor substrate in a thermal transfer chamber; comprising:

a) a roll of donor substrate;

b) a device disposed relative to the coating chamber including:

i) a frame defining an aperture and having a tensioning mechanism including a first clamp assembly having a spring-biased member and moveable along a path and a spring in engagement with the member and urging the member in a first direction along the path;

ii) means for unrolling and delivering a portion of the donor substrate from the roll to the device so that a portion of such material is disposed over the aperture; and iii) means for engaging the unrolled donor substrate and causing such material to be engaged with the first clamp assembly to tension such material; and c) means for cutting the unrolled portion of donor substrate into a sheet before or after it has been coated with organic material in the chamber.

12. The apparatus of claim 11 further including a second clamp assembly, the first and second clamp assemblies defining corresponding grooves and two spaced apart members both being moveable from a disengaged position into engagement with the unrolled donor substrate and forcing such material into the corresponding grooves.

13. The apparatus of claim 12 wherein the moveable members are made of compliant material.

* * * * *